(12) United States Patent
Izzo et al.

(10) Patent No.: US 11,231,738 B2
(45) Date of Patent: Jan. 25, 2022

(54) REDUNDANT AND DISSIMILAR SYSTEM FOR MONITORING THE STATUS OF CONTROL CONTACTORS OF AN AIRCRAFT CONTROL STICK

(71) Applicant: AIRBUS HELICOPTERS, Marignane (FR)

(72) Inventors: Pascal Izzo, Berre l'Etang (FR); Jean-Francois Laffisse, Marseilles (FR)

(73) Assignee: AIRBUS HELICOPTERS, Marignane (FR)

( * ) Notice: Subject to any disclaimer, the term of this patent is extended or adjusted under 35 U.S.C. 154(b) by 267 days.

(21) Appl. No.: 16/311,808

(22) PCT Filed: Feb. 23, 2018

(86) PCT No.: PCT/FR2018/000035
§ 371 (c)(1),
(2) Date: Apr. 13, 2020

(87) PCT Pub. No.: WO2018/158511
PCT Pub. Date: Sep. 7, 2018

(65) Prior Publication Data
US 2020/0233449 A1 Jul. 23, 2020

(30) Foreign Application Priority Data
Feb. 28, 2017 (FR) ...................................... 1700194

(51) Int. Cl.
*G05G 9/047* (2006.01)
*G01R 31/327* (2006.01)
(Continued)

(52) U.S. Cl.
CPC ..... *G05G 9/04788* (2013.01); *B64C 13/0421* (2018.01); *G01R 31/3277* (2013.01);
(Continued)

(58) Field of Classification Search
CPC ........ G01R 27/00; G01R 27/02; G01R 27/08; G01R 27/16; G01R 31/06; G05G 9/04788;
(Continued)

(56) References Cited

U.S. PATENT DOCUMENTS

| 5,508,626 A | 4/1996 | Halin et al. |
| 10,840,945 B2 | 11/2020 | De La Bardonnie |

(Continued)

FOREIGN PATENT DOCUMENTS

| EP | 0638913 A1 | 2/1995 |
| JP | H0447617 A | 2/1992 |

(Continued)

OTHER PUBLICATIONS

Written Opinion and International Search Report for PCT/FR2018/000035, Completed by the European Patent Office, dated May 17, 2018, All together 15 Pages.

(Continued)

*Primary Examiner* — Son T Le
(74) *Attorney, Agent, or Firm* — Brooks Kushman P.C.

(57) ABSTRACT

A redundant and dissimilar system for monitoring the status of contactors of an aircraft control stick. This monitoring system comprises at least one electrical power source, at least one processor and several circuits for monitoring the status of the switches of the contactors. Each monitoring circuit comprises and electrical power source, a switch for each contactor, the switches of a contactor being connected to each other, and an electronic assembly provided with receivers arranged in series with each other. Each switch is arranged in parallel with at least one receiver so as to short-circuit the at least one receiver when the switch is in the closed state. Each processor measures and analyses an electrical feature of the electronic assembly, such as a mains (Continued)

voltage VE as the terminals of the electronics assembly, in order to determine the status of each switch.

13 Claims, 2 Drawing Sheets

(51) Int. Cl.
 *B64C 13/04* (2006.01)
 *H01H 9/06* (2006.01)
(52) U.S. Cl.
 CPC ..... *H01H 9/06* (2013.01); *G05G 2009/04774* (2013.01); *H01H 2009/066* (2013.01)
(58) Field of Classification Search
 CPC .... G05G 2009/047; G05G 2009/04774; B64C 13/04; B64C 13/0421; B64C 27/56; H01H 2009/066; H01H 9/06; H01H 2239/012; H01H 9/16; H01H 9/167; H03M 11/24
 See application file for complete search history.

(56) References Cited

U.S. PATENT DOCUMENTS

| | | |
|---|---|---|
| 2007/0164168 A1 | 7/2007 | Hirvonen et al. |
| 2009/0012659 A1 | 1/2009 | McMahon et al. |
| 2012/0112558 A1 | 5/2012 | Ibe |

FOREIGN PATENT DOCUMENTS

| | | |
|---|---|---|
| JP | 2010188862 A | 9/2010 |
| WO | 2018087353 A1 | 5/2018 |

OTHER PUBLICATIONS

European Search Report (with English Machine Translation) dated Oct. 5, 2021, Application No. 18 710 086.2-1206, Applicant Airbus Helicopters, 10 Pages.

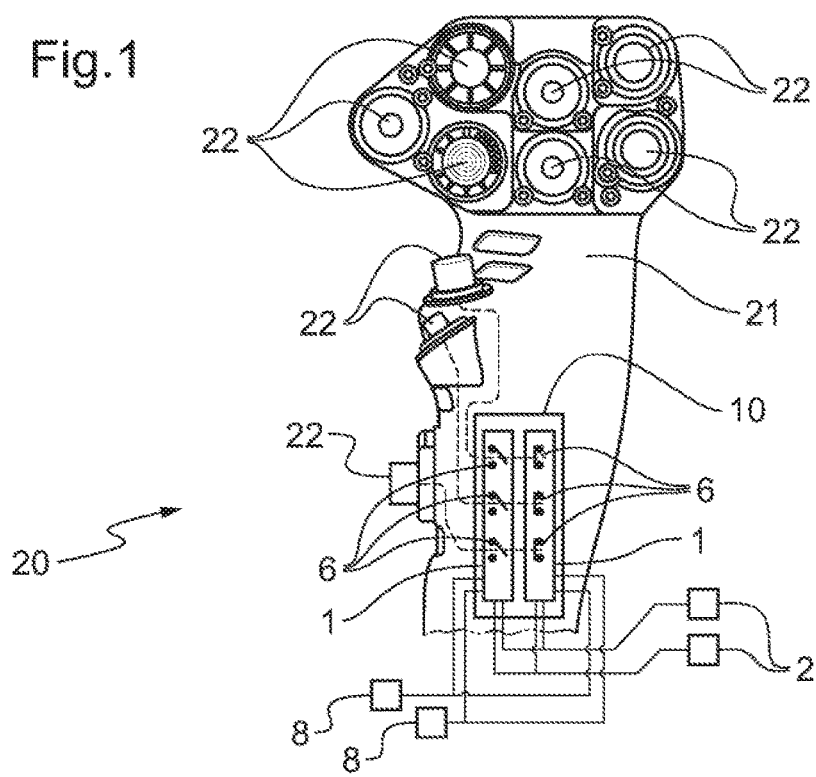
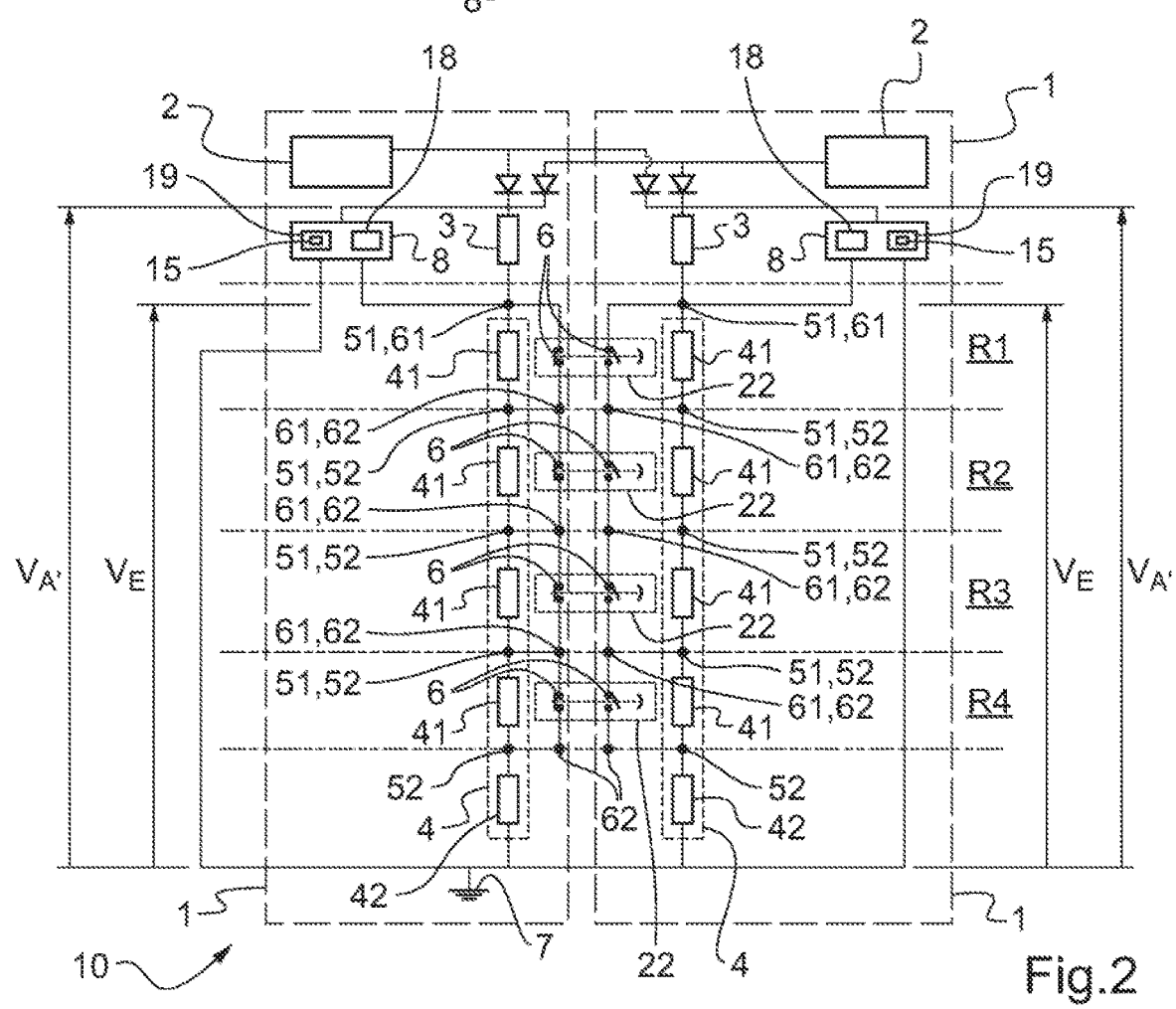

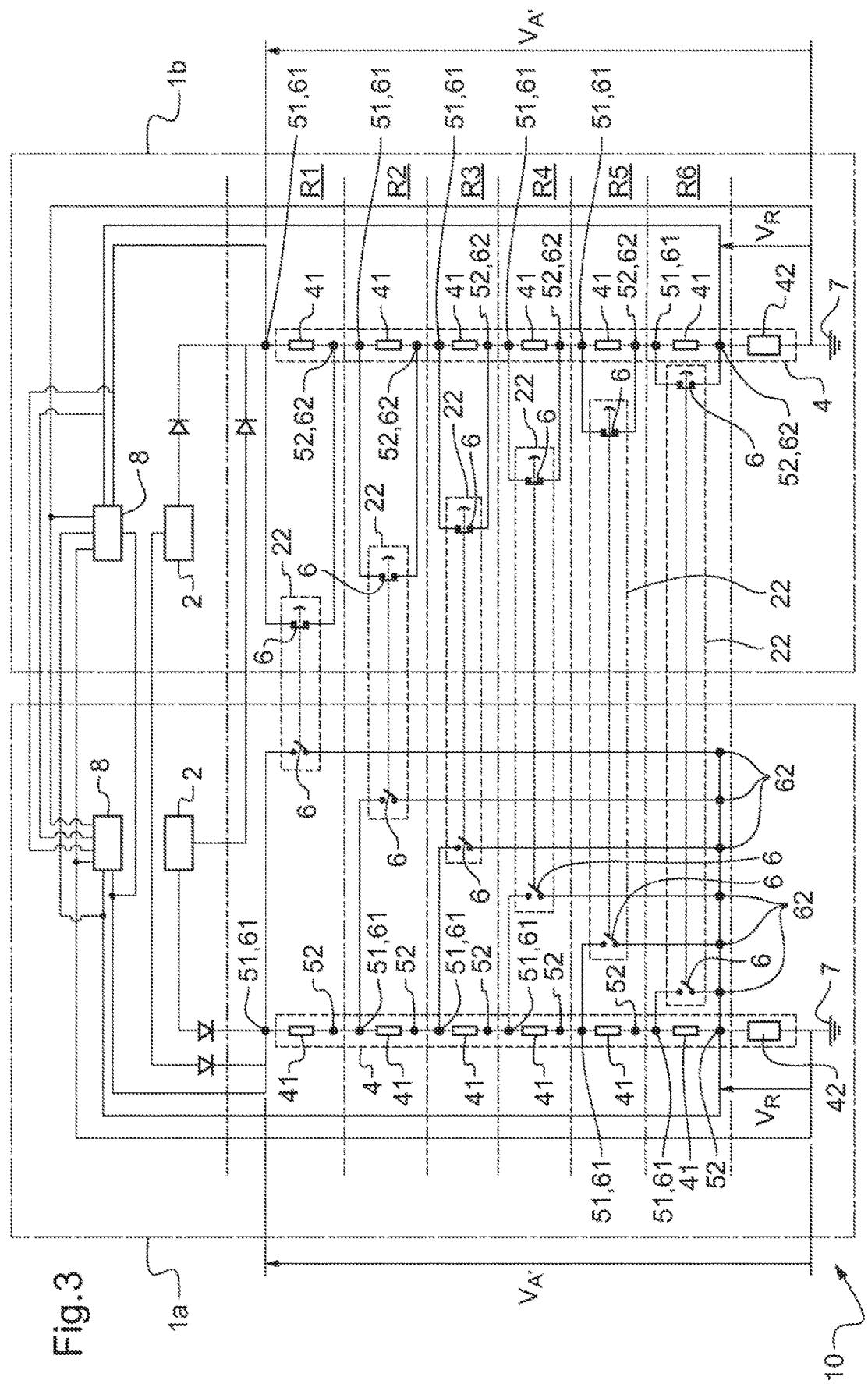

REDUNDANT AND DISSIMILAR SYSTEM FOR MONITORING THE STATUS OF CONTROL CONTACTORS OF AN AIRCRAFT CONTROL STICK

CROSS-REFERENCE TO RELATED APPLICATION

This application is the U.S. national phase of PCT Application No. PCT/FR2018/000035 filed on Feb. 23, 2018, which claims priority to French Patent Application No. FR 1700194 filed on Feb. 28, 2017, the disclosures of which are incorporated in their entirety by reference herein.

FIELD OF THE INVENTION

The present invention relates to the field of aircraft control members.

The present invention relates to a redundant and dissimilar monitoring system for monitoring the states of control contactors. The present invention also relates to a control handgrip including a redundant and dissimilar monitoring system for monitoring the states of contactors.

BACKGROUND OF THE INVENTION

More precisely, the present invention serves to detect reliably the states of one or more control contactors of a control handgrip positioned on a flight control member of an aircraft, possibly while taking account of associated safety constraints, and it also serves to detect failures of one or more of the control contactors.

An aircraft has flight control members generally formed by a stick and/or a lever. The use of control members of the mini stick or joystick type is also becoming more widespread on modern aircraft. Each control member has contactors enabling the pilot to control important functions without letting go of those control members. These contactors are positioned on a control handgrip of the control member, namely the handgrip of the stick or else the lever forming the control member, as described in Document US 2009/0012659.

Furthermore, the functions available in aircraft are becoming more numerous, such that the number of contactors present both on the instrument panel and on each control member is increasing.

It may also be observed that the number of contactors positioned on the control handgrips of control members is greater on a rotary wing aircraft than on a fixed wing aircraft. Specifically, a pilot of a rotary wing aircraft uses both hands to control two distinct control members, and it is more problematic or indeed dangerous for the pilot to let go of those control members while in flight than it is for a pilot of a fixed wing aircraft. Under such circumstances, the control handgrip of a control member of a rotary wing aircraft may have a number of contactors that is large, e.g. lying in the range fifteen to twenty.

Consequently, a large electrical harness having a large number of cables needs to be installed in the control handgrip in order to control those contactors with the electrical and/or electronic system of the aircraft, and in particular with the avionics of the aircraft.

Furthermore, in the context of functions that are considered as critical and/or safety-related, those contactors are deployed redundantly, for which purpose they have at least two switch stages and they are connected by means of cables that are likewise segregated.

As a result, the electrical harness connecting contactors of a control handgrip with the avionics of the aircraft includes a number of cables that is large, which may be of the order of twenty-four, for example, or even more.

This large number of cables making up the electrical harness leads firstly to a weight constraint, where weight is an important criterion for an aircraft.

In addition, given this large number of cables, the electrical harness that passes inside the control handgrip and the control member presents dimensions that can be penalizing for installing it and passing it inside the control handgrip and the control member, in particular with control members of the mini stick, or joystick type. As a result, installing and maintaining the electrical harness is more difficult and complicated, in particular when installing and/or changing a control handgrip.

Furthermore, the mobility and the flexibility of the electrical harness is diminished by this large number of cables and that can disturb the operation and the movement of the control member, in particular if it has a low force threshold, such as for example with control members of the mini stick type. As a result, a friction and bending force due to the electrical harness can appear in the movements of the control member, which implies degrading the accuracy with which the aircraft is piloted.

Finally, this reduced mobility and flexibility of the electrical harness can give rise, during movements of the control member, to accelerated degradation and damage to one or more cables of the electrical harness, which might lead to the loss of certain functions, or at least to the loss of control over those functions from the control handgrip.

In order to limit the above-mentioned risks and effects, it is therefore important to reduce the number of cables making up the electrical harness that provides the connection between the contactors of a control handgrip and the avionics, in particular for control members of the mini stick type, which are becoming more and more widespread on recent generation aircraft.

Solutions exist that enable the number of cables making up the electrical harness to be reduced.

For example, an analog electronic system makes it possible to provide time multiplexing of the information supplied by each contactor of the control handgrip. Nevertheless, such a multiplexed analog electronic system needs to be integrated inside the control handgrip, i.e. in a volume that is small and limited, and in an environment that is demanding in terms of temperature, vibration, and magnetism. Furthermore, a specific interface needs to be created in order to acquire the information coming from the contactors, thereby penalizing the portability of such a system from one aircraft to another. Finally, the system needs to be qualified and certified to aviation standards in order to be used in a control handgrip, and take account of those functions that are under the control of those contactors and that are considered to be critical and/or safety-related.

Another solution is to install a digital data concentrator in the control handgrip for the purpose of acquiring the states of the contactors and of propagating that information via a digital bus. The digital data concentrator makes it possible to use a small number of cables, but it still presents drawbacks in terms of integration in the control handgrip, in particular concerning dissipating heat from the digital data concentrator and taking account of the environment with its temperature, vibration, and magnetic constraints. Furthermore, since that solution is digital, integrating it within the handgrip requires development processes to be applied in compliance with aviation standards, e.g. international standards DO178 and DO254 in order to take account of functions that are considered to be critical and/or safety-related.

It is also possible to use a passive resistive circuit to form a circuit for detecting the positions of a plurality of changeover switches, as described in Document EP 0 638 913. The changeover switches have three terminals and two positions, and they are connected in parallel with one another, and a first resistor is connected in series with each switch, the first resistors being connected to one another at one of their ends. Within the detection circuit, the first terminals of all of the switches are connected together, as are the second terminals. An electrical power supply is connected to the lines formed firstly by the first terminals and secondly by the second terminals of the switches.

Furthermore, additional resistors are positioned either between the first terminal and the second terminal of each switch, or else between two consecutive first resistors. Finally, the voltage between the lines formed respectively by the first terminals of the switches and the first resistors then varies as a function of the position of each switch in predetermined manner. As a result, such a detection circuit makes it possible to detect the position of each switch.

Nevertheless, that detection takes place without putting the switches into a hierarchical order. Furthermore, that detection is possible only for changeover switches and does not work with on/off switches or pushbuttons.

In the automotive field, solutions have already been developed for implanting control buttons on a steering wheel. For example, Documents JP 2010/188862 and US 2012/0112558 describe multifunction steering wheels in which each control button is associated with a switch that is electrically connected to a resistor, the resistors being connected in series, and each switch thus being connected in parallel with one or more resistors.

Furthermore, in Document US 2012/0112558, the multifunction steering wheel includes a control unit measuring internal voltages and determining which switch is actuated. The control unit then sends an electrical output signal having a voltage that corresponds to the switch.

Also known is Document JP H04 47617, which describes an appliance having keys, such as a telephone or a remote control. Each key acts on a switch that is electrically connected in parallel with a resistor. The resistors are connected in series and they have different resistances.

BRIEF SUMMARY OF THE INVENTION

An object of the present invention is thus to provide a solution for monitoring the states of switches based on an analog electronic device that is passive and simple and that can easily be adapted to a control handgrip while using standard components.

In this context, the present invention proposes a system for monitoring the states of control contactors of a control handgrip that makes it possible to be unaffected by the above-mentioned limitations while enabling the states of one or more control contactors to be detected reliably and also enabling failures of one or more of the control contactors to be detected. The invention also provides a control handgrip for a flight control member of an aircraft and that is provided with such a monitoring system.

According to the invention, a redundant and dissimilar monitoring system for monitoring the state of control contactors comprises:

at least one electric power source generating electricity at a power supply voltage $V_A$;
at least one calculator;
a plurality of control contactors, each control contactor having a plurality of switches that are operated simultaneously; and
at least two monitor circuits for monitoring the states of the switches of the control contactors, each switch of a control contactor being integrated in a monitor circuit, each monitor circuit being connected to at least one electric power source and to at least one calculator, each monitor circuit comprising:
an electronic unit provided with a tail receiver and at least two control receivers connected in series with one another, each control receiver being respectively provided with two primary terminals; and
at least two switches respectively provided with two secondary terminals, a first secondary terminal of a switch being electrically connected to a first primary terminal of a control receiver, and each switch being connected in parallel with at least one control receiver in such a manner as to short-circuit the at least one control receiver when the switch is in the closed state, the number of the switches being equal to the number of the control receivers.

This system of the invention for monitoring the state of control contactors is intended in particular for control handgrips of flight control members of an aircraft, and in particular of a rotary wing aircraft.

This monitoring system of the invention for monitoring the state of control contactors is remarkable in that each calculator is configured to measure at least one electrical characteristic of the electronic unit and to determine the states of the switches and of the control contactors of the monitoring system.

In the redundant and dissimilar monitoring system of the invention, the monitor circuits are connected in parallel. As a result, the monitoring system of the invention is capable advantageously of monitoring and detecting an action on a control contactor corresponding to a change of state of its switches by means of each monitor circuit monitoring the switches of the control contactors in redundant manner, thereby guaranteeing that the action will be detected, even in the event of one, of the switches of the control contactor failing and/or in the event of one of the monitor circuits failing.

Furthermore, the at least two monitor circuits are dissimilar. The term "monitor circuits are dissimilar" means that the monitor circuits are different, having electrical architectures and more precisely installations of control receivers and/or of switches, that are different. As a result, the dissimilar monitor circuits are not impacted identically by a failure or a breakdown, in particular when the failure or the breakdown relates to a control contactor or to one of its switches. This dissimilarity of at least two monitor circuits serves advantageously to mitigate such a failure or such a breakdown without jeopardizing the operation and the effectiveness of the monitoring system of the invention.

This redundancy and this dissimilarity in the monitoring of the states of the contactors are obtained while advantageously minimizing the number of cables making up the electrical harness used for connecting the redundant monitoring system to the avionics of the aircraft. Specifically, this number of cables in the electrical harness is associated with the number of monitor circuits contained in the redundant monitoring system, independently of the number of control contactors.

Consequently, the redundant and dissimilar monitoring system of the invention serves advantageously to limit the weight and the volume of the electrical harness and thus makes it easier to install inside a control handgrip and a control member, in particular a control member of the mini stick or joystick type. Furthermore, because of this small number of cables, the electrical harness is very mobile and flexible regardless of the number of switches monitored, and therefore does sot disturb the operation or the movements of the control member.

Finally, this small number of cables serves to guarantee reliable operation of the monitoring system by avoiding one or more cables in the electrical harness being degraded or damaged during movements of the control member.

The redundant monitoring system may have one or more electric power sources generating electricity at a power supply voltage $V_A$ in order to power each monitor circuit. Preferably, the monitoring system has at least two electric power sources for providing electric power redundancy to the monitor circuit.

For example, the monitoring system may have a plurality of electric power sources, and each electric power source may be used to power at least two monitor circuits. Consequently, in the event of a failure of an electric power source, each monitor circuit continues to be powered by at least one electric power source and thus remains operational. Each electric power source thus serves to mitigate a failure of another electric power source.

Among other possibilities, an electric power source may be made up of a plurality of sources connected in parallel. As a result, the failure of one source can be mitigated by at least one other source.

By way of example, a control contactor is a switch with a two-position lever, a directional button having four directions, or indeed pushbutton. Each control contactor has one or more switches, with all of the switches in a series being operated simultaneously. Each switch in such a series is integrated in a respective specific monitor circuit.

Each switch has two secondary terminals and two positions corresponding to two states of the switch. An open state corresponds to an open position of the switch in which the switch does not provide, an electrical connection between its two secondary terminals. A closed state corresponds to a closed position of the switch in which the switch provides an electrical connection between its two secondary terminals.

By way of example, a control contactor may have two switches, each switch being suitable for use either in a normally open state, i.e. being in an open position at rest in which it does not provide an electrical connection so long as the control contactor is not actuated, or else in a normally closed state providing an electrical connection so long as the control contactor has not been actuated.

For each monitor circuit of the redundant and dissimilar monitoring system of the invention, each switch is connected in parallel with at least one control receiver. Consequently, a change of state in a switch serves to modify at least one electrical characteristic of the electronic unit of that monitor circuit, and in particular its resistance. For example, passing from the open state to the closed state serves to short-circuit at least one control receiver. As a result, each short-circuited control receiver does not pass an electric current, thereby modifying at least one electrical characteristic of the electronic unit.

Conversely, a switch passing from the closed state to the open state serves to eliminate the short-circuit that was applied to at least one control receiver. As a result, each previously short-circuited control receiver once more passes an electric current, thereby likewise modifying at least one electrical characteristic of the electronic unit.

Consequently, modifying the state of a switch leads to a change of at least one electrical characteristic of the electronic unit of the monitor circuit. Analyzing this change in at least one electrical characteristic of the electronic unit makes it possible to determine which control receiver has been short-circuited and advantageously to deduce therefrom which switch has changed state and also to determine its new state.

Each calculator is configured to measure at least one electrical characteristic of the electronic unit of at least one monitor circuit, and possibly an electrical characteristic of at least one monitor circuit. For this purpose, each calculator may include a measuring device. The measurement of this electrical characteristic of the electronic unit can then be used by each calculator in order to determine the state of at least one switch. This electrical characteristic of the electronic unit is measured and the measurement is processed either continuously, or else at regular intervals.

As a result, at least one electrical characteristic of the electronic unit of at least one monitor circuit, such as its resistance or a voltage characterizing the electronic unit, and that varies with varying states of the switches of the monitor circuit, is measured by each calculator of the monitoring system of the invention. Furthermore, specific values of at least this electrical characteristic of the electronic unit can be defined beforehand as a function of the state of each switch. It is these specific values of the electrical characteristic of the electronic unit that the calculator compares with the electrical characteristic of the electronic unit as measured by the measuring device in order to determine the state of at least one switch.

For this purpose, the calculator may include a memory storing firstly these specific values of at least one electrical characteristic of the electronic unit and secondly an algorithm for comparing these specific values with each electrical characteristic of the electronic unit as measured by the calculator.

Preferably, the electrical characteristic of the electronic unit that is measured by the measuring device is a voltage serving to characterize the electronic unit of the monitor circuit.

The calculator may include an analysis device for analyzing each measured electrical characteristic and comparing it with specific values.

Furthermore, a reference voltage $V_{A'}$ may be measured across the terminals of each monitor circuit by at least one calculator, this voltage $V_{A'}$ corresponding substantially to the power supply voltage $V_A$ generated by an electric power source. This at least one calculator, which has also measured the voltage characterizing the electronic unit, can then compare the ratio of this voltage characterizing the electronic unit divided by the reference voltage $V_{A'}$ with predefined specific values in order to determine the state of at least one switch.

As a result, any variation or disturbance to the power supply voltage $V_A$ generated by an electric power source is advantageously taken into account in order to avoid any error associated with such variation or disturbance to the power supply voltage $V_A$. By way of example, such an error could be failure to detect a change of state of a switch, an error in identifying which switch has changed state, or indeed falsely detecting a change of state of a switch, i.e. detecting a change of state that has not happened. By way of example, a variation or disturbance in the power supply voltage $V_A$ may be due to a variation in temperature or indeed to the presence of an interfering resistance in the power circuit or indeed to a defect of an electric power source.

This voltage characterizing the electronic unit may for example be a first network voltage $V_E$ measured across the terminals of the electronic unit, with at least one calculator being electrically connected to the terminals of the electronic unit. The monitor circuit then has a top receiver connected in series with the electronic unit and located by way of example between each electric power source and the electronic unit. The top receiver serves in particular, in combination with the electronic unit, to define a first network voltage $V_E$ across the terminals of the electronic unit that is different from the reference voltage $V_{A'}$. Without any action on the control contactors, this reference voltage $V_{A'}$ serves to monitor the electrical state of the control receivers that are not short-circuits by the switches. Preferably, the top receiver is a passive two-pole circuit that is purely resistive, such as a resistor.

This voltage characterizing the electronic unit may also be a second network voltage $V_A$ measured across the terminals of the tail receiver, with at least one calculator being electrically connected to the terminals of the tail receiver.

In both situations, at least one calculator may be configured to determine the state of the switches and of the control contactors directly from this voltage characterizing the electronic unit. As described above, at least one calculator may also be configured to determine the ratio of the voltage characterizing the electronic unit divided by the reference voltage $V_{A'}$ across the terminals of the monitor circuit, and to deduce therefrom the states of the switches and of the control contactors.

In general manner, an electronic unit has n control receivers and n switches, n being a positive integer greater than or equal to 2. It is assumed that a switch of rank i, i lying in the range 1 to n, is situated upstream from a switch of rank (i+1) and downstream from a switch of rank (i−1), taking the position of the electric power supply as being the point furthest upstream.

The switch of rank 1 is thus the switch closest to the electric power source, and the switch of rank n is the furthest away therefrom.

Each receiver, whether a control receiver or a tail receiver includes at least one electronic two-pole circuit, such as a diode or a resistor, for example. Each receiver preferably includes one or more passive two-pole circuits that are purely resistive. When each electronic two-pole circuit in these receivers is a diode, each receiver preferably has two diodes and each monitor circuit has a top receiver including at least one resistor in order to limit the current flowing through the monitor circuit.

In a first embodiment of a monitor circuit of the monitoring system of the invention, a second secondary terminal of a switch is electrically connected to a second primary terminal of a control receiver. As a result these switches are connected in series with one another and each switch is connected in parallel with a single control receiver in order to short-circuit the control receiver when the switch is in the closed state.

Consequently, each switch serves to short-circuit a single control receiver connected in parallel with that switch and independently of the other control receivers of the monitor circuit, thereby modifying at least one electrical characteristic of the electronic unit. Consequently, each calculator serves advantageously to identify changes of state taking place simultaneously in a plurality of switches.

When the control receivers are substantially identical in terms of electrical characteristics, e.g. such as their resistances, the calculator serves to determine the number of switches that have changed state between two successive measurements or over a predefined time period, and also the number of switches in each state, i.e. the open state and the closed state.

When the control receivers are different in terms of electrical characteristics and when they are defined in such a manner that the specific values of at least one electrical characteristic of the electronic unit are if for each state of each switch, the calculator also serves advantageously to identify the state of each switch.

Furthermore, in this first embodiment, the monitor circuit makes it possible to use as a switch either a switch that is normally open, i.e. that serves to create an electrical connection when it is actuated, or else a switch that is normally closed, i.e. that serves to break an electrical connection when it is actuated.

In a second embodiment of a monitor circuit of the monitoring system of the invention, the switches are connected in parallel with one another, a second secondary terminal of each switch being electrically connected to a second secondary terminal of the other switches. As a result, each switch of rank i is connected in parallel with (n−i+1) control receiver(s) so as to short-circuit those (n−i+1) control receiver(s) and switch(es) of rank greater than the rank i when the switch of rank i is in the closed state.

In the closed state, each switch serves to short-circuit simultaneously one, or more control receivers and possibly one, or more, switches connected in parallel and downstream from, that switch. Each switch thus serves to make the "downstream" switches ineffective on the monitor circuit. Consequently, this second embodiment serves advantageously to create a hierarchy of switches, a switch having a hierarchical level that is greater than a switch situated downstream therefrom and a hierarchical level that is lower than a switch situated upstream therefrom.

Consequently, the calculator serves to identify the closed state of only one switch at a time. Specifically, each switch downstream from that switch in the closed state is short-circuited and is therefore not detected, whereas the switches upstream therefrom are in the open state.

For example, if two switches switch to the closed state simultaneously, the calculator will detect only the change of state of the switch that has the higher hierarchical level, i.e. the switch that is further upstream.

A monitor circuit in this second embodiment operates in similar manner regardless of whether the control receivers have electrical characteristics that are different or substantially identical. Nevertheless, the control receivers are preferably substantially identical, in particular in order to make it easier to define the specific values of the electrical characteristics of the electronic unit, since they are then proportional.

Preferably, in this second embodiment, a monitor circuit has switches that are normally open. Nevertheless, normally closed switches can also be used, while taking their hierarchical levels into account. Under such circumstances, any action on a switch downstream from a normally closed switch has no effect on the electrical characteristics of the electronic unit and is therefore not detected so long as that normally closed switch does not pass to the open state.

A third embodiment of a monitor circuit for a monitoring system of the invention is obtained by combining the first embodiment and the second embodiment. The switches of rank j, j being a positive integer lying in the range 1 to m, m being a positive integer lying in the range 1 to n, are connected in series with one another as in the first embodiment so that each switch of rank j is connected in parallel with a single control receiver in order to short-circuit the control receiver when the switch of rank j is in the closed state. The switches of rank k, k being a positive integer lying in the range (m+1) to n, are connected in parallel with one another as in the second embodiment, a second secondary terminal of each switch of rank k being electrically connected to a second secondary terminal of the switches of rank (m+1) to n so that each switch of rank k is connected in parallel with (n−k+1) control receiver(s) in order to short-circuit the (n−k+1) control receiver(s) and (n−k) switch(es) of rank greater than the rank k when the switch of rank k is in the closed state.

Whatever the embodiment, each monitor circuit serves advantageously to minimize the number of cables making up the electrical harness used for connecting the monitoring system to the avionics of the aircraft and thus for monitoring the state of all of the switches. Furthermore, this number of cables is independent of the number of switches to be monitored.

The monitoring system of the invention can then include at least two monitor circuits in accordance respectively with at least two of these embodiments, thus ensuring the presence of at least two monitor circuits that are dissimilar.

Furthermore, monitoring system of the invention may also include at least one control contactor having at least two switches with states that are different at rest and at least two monitor circuits connected to those at least two switches. As a result, those at least two monitor circuits are different and dissimilar.

Regardless of the embodiment and as a result of the redundancy and the dissimilarity of the monitor circuit, the monitoring system thus guarantees very good testability of the switches of the control contactors by making it possible to detect various different failure modes of those switches, in particular when the measured electrical characteristic of the electronic unit does not correspond to any of the specific values for that electrical characteristic as defined for changing the state of each switch. Advantageously, the monitoring system of the invention also makes it possible to locate a failure in a monitor circuit.

By way of example, the failure modes that are detected comprise a failure of a switch when starting the monitor circuit, the measured electrical characteristic of the electronic unit then not corresponding to the known specific value of the initial rest state. A short-circuit or an open circuit on a control receiver can also be detected by duplicating the control receiver, e.g. as two sub-receivers. As a result, a failure, such as a short-circuit, on one of the two sub-receivers leads to a measured electrical characteristic of the electronic unit that then does not correspond to any specific value.

A switch that remains "stuck" in spite of action on the control contactor or after such action has been stopped, is also advantageously detected, in particular by simultaneous use of a normally closed switch and of a normally open switch of a single control contactor on two different monitor circuits.

The use of an electric power source generating a stable voltage is preferable for detecting these failures in reliable manner and for avoiding detecting false failures. Nevertheless, using the ratio between the voltage characterizing the electronic unit and the reference voltage $V_{A'}$ across the terminals of the monitor circuit, it is possible to mitigate any variation or disturbance in the power supply electric voltage $V_A$ generated by the electric power source.

The present invention also provides a control handgrip for a flight control member of an aircraft that includes a handgrip and control contactors together with a redundant and dissimilar monitoring system as described above for monitoring the states of control contactors. One or more electric power sources of the monitoring system may be arranged outside the control handgrip. Likewise, one or more calculator of the monitoring system may be arranged outside the control handgrip.

Furthermore, each electric power source and each calculator may be used in common and redundant manner by a plurality of control handgrips having such a redundant and dissimilar monitoring system for monitoring the states of control contactors. The present invention makes it possible to connect a plurality of calculators to a single monitoring system.

BRIEF DESCRIPTION OF THE DRAWINGS

The invention and its advantages appear in greater detail in the context of the following description of embodiments given by way of illustration and with reference to the accompanying figures, in which:

FIG. 1 shows a control handgrip of a flight control member of an aircraft; and

FIGS. 2 and 3 show two examples of a redundant and dissimilar monitoring system for monitoring the states of control contactors.

Elements present in more than one of the figures are given the same references in each of them.

DETAILED DESCRIPTION OF THE INVENTION

FIG. 1 shows a control handgrip 20. The control handgrip 20 comprises a handgrip 21 and a redundant and dissimilar monitoring system 10 for monitoring the states of control contactors 22, the monitoring system 10 being provided with control contactors 22 and two monitor circuits 1 for monitoring the states of the switches 6 of the control contactors 22. The control handgrip 20 is positioned at the end of a control member (not shown) for controlling the flight of an aircraft, such as a stick, a lever, or indeed a joystick, for example. Each control contactor 22 has two switches 6 that are controlled simultaneously so that both switches of a control contactor 22 change state, simultaneously when action is taken on the control contactor 22. Each monitor circuit 1 includes one of the switches 6 of each control contactor 22.

Two examples of a redundant and dissimilar monitoring system 10 for monitoring the state of control contactors 22 are shown in FIGS. 2 and 3.

In both of these examples, a monitoring system 10 comprises two electric power sources 2, two calculators 8, and two monitor circuits 1. Each monitor circuit 1 has a plurality of switches 6 and an electronic unit 4 provided with a plurality of control receivers 41 and a tail receiver 42.

The calculator 8 includes a measuring device 18, an analysis device 19, and a memory 15.

Each electric power source 2 is electrically connected to two monitor circuits 1, and in each monitor circuit 1 it generates electricity having a power supply voltage $V_A$. Each calculator 8 is electrically connected to at least one monitor circuit 1 in order to act via the measuring device 18 to measure at least one electrical characteristic of the electronic unit of a monitor circuit 1 and at least one electrical characteristic of a monitor circuit 1.

A measured electrical characteristic of an electronic unit 4 may for example be a voltage characterizing the electronic unit 4. Likewise, an electrical characteristic of a monitor circuit 1 may for example be a reference voltage $V_{A'}$ measured across the terminals of the monitor circuit 1.

The electronic unit 4 of each monitor circuit 1 includes a tail receiver 42 and a plurality of control receivers 41 connected in series, the number of control receivers 41 being equal to the number of switches in the monitor circuit 1. Each control receiver 41 has two primary terminals 51 and 52, and by way of example may be a passive two-pole circuit that is purely resistive. Each switch 6 is provided with two secondary terminals 61 and 62 and has two positions corresponding respectively to an open state and to a closed state of the switch 6.

In general manner, each control receiver 41 and each switch 6 can be identified by its rank relative to the positions of the electric power sources 2. Thus, a control receiver 41 and a switch 6 of rank R1 are the control receiver 41 and the switch 6 that are closest to the electric power sources 2. Conversely, a control receiver 41 and a switch 6 of rank Rn, where n is the number of control receivers 41 and the number of switches 6, are the control receiver 41 and the switch 6 that are farthest from the power sources 2.

For these two examples of a monitoring system 10, the two monitor circuits 1 of each monitoring system 10 are dissimilar, i.e. their electrical architectures are different, with the ways the control receivers 41 and/or the switches 6 are installed being different.

In a first example of a monitoring system 10 as shown in FIG. 2, the electrical architectures of the two monitor circuits 1 differ solely in the rest states of the switches 6 of each control contactor 22.

Each monitor circuit 1 has a top receiver 3, four switches 6, and an electronic unit 4 made up by a tail receiver 42 and four control receivers 41. The top 3 is connected in series with the tail receiver 42 and the four control receivers 41, and it is placed upstream from the electronic unit 4. The top receiver 3 may be a resistor, for example. Each switch 6 is placed in parallel with a control receiver 41, each secondary terminal 61, 62 of a switch 6 being connected electrically to a respective primary terminal 51, 52 of the control receiver 41. As a result, the switches 6 are connected in series with each other. The second primary terminal 52 of the control receiver 41 of rank R4 and the second secondary terminal 61 of the switch 6 of rank R4 are electrically connected to the tail receiver 42, which is itself electrically connected to a ground 7 of the monitor circuit 1.

For one monitor circuit 1, the switches 6 are in the open state when at rest, i.e. each switch 6 is in the open position so long as no action is exerted on the corresponding control contactor 22, whereas for the other monitor circuit 1, the switches 6 are in the closed state at rest, i.e. each switch 6 is in the closed position so long as no action is exerted on the corresponding control contactor 22.

Consequently, each switch 6 in the closed state short-circuits the control receiver 41 connected in parallel with that switch 6, regardless of the state of any other switch 6.

Furthermore, the control receivers 41 have electrical characteristics, and in particular resistances, that are specific and different, such that the resistance of the electronic unit 4 varies and is equal to different values for each state of each switch 6. On the basis of these different resistance values of the electronic unit 4, specific values of the first network voltage $V_E$ across the terminals of the electronic unit 4 are defined beforehand for each state of each switch 6 as a function of the power supply voltage $V_{A'}$ of the resistance of the top receiver 3, and of the state of each of the switches 6 of the first monitor circuit 1a. Specific ratios of the first network voltage $V_E$ divided by the power supply voltage $V_A$ corresponding to different states of each of the switches 6 are stored in the memory 15.

Each calculator 8 is electrically connected to a single monitor circuit 1. Under such circumstances, each calculator 8 uses its respective measurement device 18 to measure the network voltage $V_E$ across the terminals of the electronic unit 4 of the monitor circuit 1 to which it is connected and also to measure the reference voltage $V_{A'}$ across the terminals of the monitor circuit 1. Thereafter, each calculator 8 makes use of its respective analysis device 19 to compare the ratio of this first network voltage $V_E$ divided by the reference voltage $V_{A'}$ with these specific ratios in order to identify the state of each of the switches 6, regardless of their rank and for each of their open or closed states.

In a second example of a monitoring system 10, as shown in FIG. 3, the electrical architectures of the two monitor circuits 1 differ firstly by how the switches 6 of each control contactor 22 are installed and secondly by the rest state of those switches 6. Each monitor circuit 1 has a tail receiver 42, six control receivers 41, and six switches 6.

Each calculator 8 is electrically connected to both monitor circuits 1 in order to use its measuring device 18 to measure at least one electrical characteristic of the electronic unit 4 of each monitor circuit 1 and an electrical characteristic of each monitor circuit 1.

For a first monitor circuit 1a of this monitoring system 10, a first secondary terminal 61 of each switch 6 is electrically connected to a first primary terminal 51 of a single control receiver 41, and the first primary terminal 51 of each control receiver 41 is electrically connected to the first secondary terminal 61 of a single switch 6. The second secondary terminals 62 of each switch 6 are electrically connected to one another and to the second primary terminal 52 of the control receiver 41 of rank R6 and to the tail receiver 42, which is itself electrically connected to the ground 7 of this first monitor circuit 1a.

As a result, each switch 6 is connected in parallel with one or more control receivers 41 and where appropriate with the switch(es) 6 situated downstream from that switch 6. Consequently, each switch 6 in the closed state short-circuits the control receiver(s) 41 situated in parallel with that switch 6, and also, where applicable, the switch(es) 6 likewise situated downstream from that switch 6.

As a result, the first monitor circuit 1a puts the switches 6 into a hierarchy, a switch 6 in the closed state masking each switch 6 downstream therefrom, such that each downstream switch 6 has no effect or the first monitor circuit 1a.

For example, the switch 6 of rank R3 when in the closed position short-circuits the three control receivers 41 of ranks R3 to R6 and also the switches 6 of ranks R4 to R5. This switch 6 of rank R3 thus serves to mask the switches of ranks R4 to R6.

Furthermore, a change in the state of a switch 6 changes the resistance of the electronic unit 4, which resistance has different values for each state of each switch 6.

These different resistance values of the electronic unit 4 are predefined as a function of the resistance of each control receiver 41. Specific values of a second network voltage $V_R$ measured across the terminals of the electronic unit 4 are defined beforehand for each state of each switch 6 as a function of the power supply voltage $V_{A'}$ of the resistance of the tail receiver 42, and of the state of each of the switches 6 of this first monitor circuit 1a. Specific ratios of the second network voltage $V_R$ divided by the power supply voltage $V_A$ and corresponding to the various states of each of the switches 6 are stored in the memory 15.

For a second monitor circuit 1b of this monitoring system 10, each switch 6 is connected in parallel with a single control receiver 41, each secondary terminal 61, 62 of a switch 6 being connected to a primary terminal 51, 52 of the control receiver 41. As a result, the switches 6 of the second monitor circuit 1b are connected in series.

Under such circumstances, the two calculators 8, which are electrically connected to the terminals of each monitor circuit 1a, 1b and to the terminals of the tail receiver 42 of each electronic unit 4 of each of these two monitor circuits 1a, 1b make it possible by means of their respective measurement devices 18 to measure the second network voltage $V_A$ measured across the terminals of the tail receiver 42 of the electronic unit 4 of each of these monitor circuits 1a, 1b, and also the reference, voltage $V_{A'}$ measured across the terminals of each of these two monitor circuits 1a, 1b. Thereafter, the two calculators 8 make use of their respective analysis devices 19 to compare the ratio of the second network voltage $V_R$ divided by the reference voltage $V_{A'}$ for each of these two monitor circuits 1a, 1b with specific ratios for each of these two monitor circuits 1a, 1b in order to determine the states of each of the switches 6 of these two monitor circuits 1a, 1b.

Furthermore, for all of the switches 6 of the first monitor circuit 1a, both calculators 8 are capable of identifying the switch 6 of lowest rank that is in the closed state. Each switch 6 of lower rank is then in the open state and each switch of higher rank is in a state that is unknown since it is short-circuited by that switch 6 of lowest rank that is in the closed state.

For the first monitor circuit 1a, the switches 6 are in the open state at rest, i.e. each switch 6 is in the open position so long as no action is exerted on the corresponding control contactor 22, whereas for the second monitor circuit 1b, the switches 6 are in the closed state at rest, i.e. each switch 6 is in the closed position so long as no action is exerted on the corresponding control contactor 22.

Furthermore, in FIG. 1, the monitoring system 10 makes use of two electric power sources 2 and two calculators 8 that are located outside the handgrip 21.

The electric power sources 2 and the calculators 8 may equally well be arranged outside the control member that includes the control handgrip 20.

Naturally, the present invention may be subjected to numerous variations as to its implementation. Although several embodiments are described, it will readily be understood that it is not conceivable to identify exhaustively all possible embodiments. It is naturally possible to envisage replacing any of the means described by equivalent means without going beyond the ambit of the present invention.

In particular, two monitor circuits 1 may use two distinct switches 6 of a given control contactor 22, as shown in the figures, with these distinct switches 6 then essentially being in the open state or the closed state at rest. Nevertheless, two monitor circuits 1 could equally well use a single switch 6 of a control contactor 22, this switch 6 then being in the open state at rest for one monitor circuit 1 and in the closed state at rest for the other monitor circuit 1.

The invention claimed is:

1. A redundant and dissimilar monitoring system for monitoring the state of control contactors, said redundant and dissimilar monitoring system comprising:

at least one electric power source generating electricity at a power supply voltage $V_A$;

at least one calculator;

a plurality of control contactors, each control contactor having a plurality of switches that are operated simultaneously; and at least two monitor circuits for monitoring the states of said switches of said control contactors, each switch of a control contactor being integrated in a respective monitor circuit, each monitor circuit being connected to at least one electric power source and to at least one calculator, each monitor circuit comprising:

an electronic unit having a tail receiver and at least two control receivers connected in series with one another, each control receiver being provided with two respective primary terminals; and at least two switches provided respectively with two secondary terminals, a first secondary terminal of a switch being electrically connected to a first primary terminal of a control receiver, and each switch being connected in parallel with at least one control receiver in such a manner as to short-circuit said at least one control receiver when said switch is in the closed state, the number of said switches being equal to the number of said control receivers;

the redundant and dissimilar monitoring system being characterized in that each calculator is configured to measure at least one electrical characteristic of said electronic unit and to determine the states of said switches and of said control contactors.

2. The redundant and dissimilar monitoring system according to claim 1, characterized in that each control receiver comprises at least one two-pole electronic circuit that is passive.

3. The redundant and dissimilar monitoring system according to claim 2, characterized in that each control receiver includes at least one diode.

4. The redundant and dissimilar monitoring system according to claim 2, characterized in that each control receiver includes at least one resistor.

5. The redundant and dissimilar monitoring system according to claim 1, characterized in that said at least one calculator connected to said monitor circuit is electrically connected firstly to the terminals of said monitor circuit so as to measure a voltage $V_{A'}$ across the terminals of said monitor circuit, and secondly to the terminals of said electronic unit so as to measure a first network voltage $V_E$ across the terminals of said electronic unit, said monitor circuit including a top receiver connected in series with said electronic unit, said at least one calculator being configured to determine the ratio of said first network voltage $V_E$, across the terminals of said electronic unit divided by said voltage $V_{A'}$ across the terminals of said monitor circuit and to deduce therefrom the states of said switches and of said control contactors.

6. The redundant and dissimilar monitoring system according to claim 1, characterized in that said at least one calculator connected to said monitor circuit is electrically connected firstly to the terminals of said monitor circuit in such a manner as to measure a voltage $V_{A'}$ across the terminals of said monitor circuit as secondly to the terminals of said tail receiver of said electronic unit in such a manner as to measure a second network voltage $V_R$ across the terminals of said tail receiver, said at least one calculator being configured to determine the ratio of said second network voltage $V_R$ across the terminals of said tail receiver divided by said voltage $V_{A'}$ across the terminals of said monitor circuit, and to deduce therefrom the states of said switches and of said control contactors.

7. The redundant and dissimilar monitoring system according to claim 1, characterized in that, for at least one monitor circuit, a second secondary terminal of a switch is connected to a second primary terminal of a control receiver so that said switches are connected in series with one another and each switch is connected in parallel with a single control receiver in order to short-circuit said control receiver when said switch is in the closed state.

8. The redundant and dissimilar monitoring system according to claim 1, characterized in that, for at least one monitor circuit, said electronic unit includes n control receivers, where n is a positive integer greater than or equal to 2, and said switches are connected in parallel with one another and a second secondary terminal of each switch is connected to a second secondary terminal of said other switches in such a manner that said switch of rank i, i being a positive integer in the range 1 to n, is connected in parallel with (n−i+1) control receive(s) so as to short-circuit said (n−i+1) control receiver(s) and (n−i) switch(es) of rank higher than the rank i when said switch of rank i is in the closed state.

9. The redundant and dissimilar monitoring system according to claim 1, characterized in that, for at least one monitor circuit, said electronic unit has n control receivers, n being a positive integer greater than or equal to 2, said switches of rank j, j being a positive integer lying in the range 1 to m, m being a positive integer lying in the range 1 to n, said switches are connected in series with one another so that each switch of rank j is connected in parallel with a single control receiver in order to short-circuit said control receiver when said switch of rank j is in the closed state, and said switches of rank k, k being a positive integer lying in the range (m÷1) to n, are connected in parallel with one another, a second secondary terminal of each switch of rank k being connected to a second secondary terminal of said switches of rank (m÷1) to n so that each switch of rank k is connected in parallel with (n−k+1) control receiver(s) in order to short-circuit said (n−k+1) control receiver(s) and (n−k) switch(es) of rank greater than the rank k when said switch of rank k is in the closed state.

10. The redundant and dissimilar monitoring system according to claim 1, characterized in that at least one control contactor includes at least two switches having different rest states and in that said monitor circuits connected to said at least two switches are different and dissimilar.

11. A control handgrip comprising a handgrip and control contactors, said control handgrip being characterized in that it includes a redundant and dissimilar monitoring system according to claim 1 for monitoring the state of control contactors, each control contactor having a plurality of switches that are controlled simultaneously.

12. The control handgrip according to claim 11, characterized in that at least one electric power source of said monitoring system is arranged outside said control handgrip.

13. The control handgrip according to claim 11, characterized in that at least one calculator of said monitoring system is arranged outside said control handgrip.

* * * * *